(12) United States Patent
Tsai

(10) Patent No.: US 11,349,455 B2
(45) Date of Patent: May 31, 2022

(54) POWER DIVIDER, RADIO FREQUENCY TRANSCEIVER AND MULTI-STAGE POWER DIVIDER

(71) Applicant: INDUSTRIAL TECHNOLOGY RESEARCH INSTITUTE, Hsinchu (TW)

(72) Inventor: Zuo-Min Tsai, Miaoli (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/729,282

(22) Filed: Dec. 27, 2019

(65) Prior Publication Data
US 2021/0203307 A1 Jul. 1, 2021

(51) Int. Cl.
| H03H 11/36 | (2006.01) |
| H04B 1/40 | (2015.01) |
| H01P 5/16 | (2006.01) |
| H03H 11/16 | (2006.01) |

(52) U.S. Cl.
CPC .............. *H03H 11/36* (2013.01); *H01P 5/16* (2013.01); *H03H 11/16* (2013.01); *H04B 1/40* (2013.01)

(58) Field of Classification Search
CPC .......... H03H 11/36; H03H 11/16; H03H 7/42; H04B 1/40; H01P 5/16; H03G 3/20
See application file for complete search history.

(56) References Cited

U.S. PATENT DOCUMENTS

| 6,128,478 A * | 10/2000 | Kim ..................... H03F 1/0288 330/124 R |
| 7,616,054 B2 | 11/2009 | Jeon et al. |
| 7,668,517 B2 | 2/2010 | Li |
| 8,005,445 B2 | 8/2011 | Kuriyama et al. |
| 8,180,311 B2 | 5/2012 | Behzad et al. |

(Continued)

FOREIGN PATENT DOCUMENTS

| CN | 105830339 A | 8/2016 |
| TW | I346466 B | 8/2011 |

(Continued)

OTHER PUBLICATIONS

TW Office Action in Application No. 109105672 dated May 8, 2020.

Primary Examiner — Yuwen Pan
Assistant Examiner — Fatuma G Sherif
(74) Attorney, Agent, or Firm — Maschoff Brennan

(57) ABSTRACT

This invention discloses a power divider, a radio frequency transceiver and a multi-stage power divider, the power divider comprises a variable gain amplifier, a power dividing circuit, a power detection circuit and a comparison circuit. The variable gain amplifier comprises a first input terminal, a control terminal and a first output terminal, the first input terminal is configured to receive a first local oscillation signal, and the first output terminal outputs a variable output signal to the power dividing circuit. The power dividing circuit outputs a second local oscillation signal to a next stage power divider and outputs a third local oscillation signal to an up/down converter. The power detection circuit outputs a detection voltage. The comparison circuit receives a reference voltage and the detection voltage and compares the reference voltage with the detection voltage and outputs a bias voltage to the power terminal based on a comparison result.

17 Claims, 13 Drawing Sheets

(56) References Cited

U.S. PATENT DOCUMENTS

| | | | |
|---|---|---|---|
| 8,742,798 B2 | 6/2014 | Arora et al. | |
| 9,621,387 B1* | 4/2017 | Magers | H04B 1/48 |
| 9,912,425 B2 | 3/2018 | Laaser et al. | |
| 2007/0129031 A1* | 6/2007 | Newton | H04B 17/14 |
| | | | 455/127.2 |
| 2009/0023405 A1 | 1/2009 | Forstner | |
| 2011/0053547 A1* | 3/2011 | Yahav | H03D 7/00 |
| | | | 455/317 |
| 2011/0306311 A1 | 12/2011 | Chang et al. | |
| 2016/0329921 A1 | 11/2016 | Jussila et al. | |
| 2018/0019858 A1* | 1/2018 | Pei | H04B 1/006 |
| 2019/0165738 A1* | 5/2019 | Pan | H03F 3/604 |

FOREIGN PATENT DOCUMENTS

| | | |
|---|---|---|
| TW | I593260 B | 7/2017 |
| WO | 2018/081164 A1 | 5/2018 |

* cited by examiner

POWER DIVIDER, RADIO FREQUENCY TRANSCEIVER AND MULTI-STAGE POWER DIVIDER

BACKGROUND

1. Technical Field

This disclosure relates to a power divider, a radio frequency transceiver applying the power divider and a multi-stage power divider applying the power divider.

2. Related Art

An up/down converter has a radio frequency signal port, an intermediate signal port and a local oscillation signal port, and an output port of a power divider is configured to provide a local oscillation signal to the local oscillator signal port of the up/down converter, for driving the up/down converter. Therefore, when the number of the up/down converters which need to be driven is changed, a circuit layout of the power divider must be redesigned to make the number of output ports of the power divider equal to the number of the up/down converters.

The power divider is capable of distributing the power of a received initial local oscillation signal evenly to generate a plurality of local oscillation signals to drive the plurality of up/down converters respectively. Therefore, when the number of up/down converters is increased, the power of the received initial local oscillation signal inputted into the power divider needs to be increased to ensure that the power of the local oscillation signal inputted into each of the up/down converters is enough to drive each of the up/down converters.

On the other hand, when the number of output ports of the power dividers is increased, it will easily happen that the IF signal lines have to extend across the internal lines of the power divider.

SUMMARY

Accordingly, this disclosure provides a power divider, a radio frequency transceiver and a multi-stage power divider, the power divider does not require an initial local oscillation signal with a large power and also can generate a local oscillation signal whose power is sufficient to drive the up/down converter. When the number of desired up/down converters is increased, a user only needs to increase the number of the power dividers for driving the desired up/down converters according to the number of the desired up/down converters.

According to one or more embodiment of this disclosure, a power divider comprises a variable gain amplifier, a power dividing circuit, a power detection circuit and a comparison circuit, the variable gain amplifier comprises a first input terminal, a control terminal and a first output terminal, and the first input terminal is configured to receive a first local oscillation signal, and a voltage of the control terminal determines a gain between the variable output signal of the first output terminal and the first local oscillation signal. The power dividing circuit comprises a second input terminal, a second output terminal, and a third output terminal. The second input terminal is electrically connected to the first output terminal, and the second output terminal outputs a second local oscillation signal based on the variable output signal. The third output terminal is configured to output a third local oscillation signal to an up/down converter based on the variable output signal. The power detection circuit comprises a third input terminal and a fourth output terminal. The third input terminal is electrically connected to the third output terminal and the fourth output terminal outputs a detection voltage. The comparison circuit comprises a fourth input terminal, a fifth input terminal, and a fifth output terminal. The fourth input terminal is configured to receive a reference voltage, and the fifth input terminal is electrically connected to the fourth output terminal and receives the detection voltage, and the fifth output terminal is electrically connected to the control terminal and outputs a bias voltage to the control terminal based on a comparison result.

According to one or more embodiment of this disclosure, a radio frequency transceiver comprises the power divider and a up/down converter, and the up/down converter comprises an intermediate frequency (IF) signal terminal, a local oscillation (LO) signal terminal and an radio frequency (RF) signal terminal, and the intermediate frequency signal terminal is configured to receive an IF signal, the local oscillation signal terminal is electrically connected to the third input terminal of the power detection circuit, and the radio frequency signal terminal is configured to output a RF signal According to one or more embodiment of this disclosure, a multi-stage power divider comprises two power dividers, wherein one of the two power dividers is a first power divider and the other of the two power dividers is a second power divider, and the second output terminal of the first power divider is electrically connected to the first input terminal of the second power divider.

In view of the above description, the power divider, the radio frequency transceiver and the multi-stage power divider disclosed by the present invention at least have the following efficiencies:

(1) When the number of the desired up/down converters is increased, a user only needs to increase the number of power dividers according to the number of desired up/down converters to ensure that all of the desired up/down converters are driven without redesigning the circuit layout of the power divider, so the power divider and the up/down converter are easier to integrate into an integrated circuit.

(2) Through the variable gain amplifier of the power divider, the power divider does not require an initial oscillation signal with a large power, and also can provide a local oscillation signal whose power is sufficient to drive the up/down converter.

BRIEF DESCRIPTION OF THE DRAWINGS

The present disclosure will become more fully understood from the detailed description given herein below and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
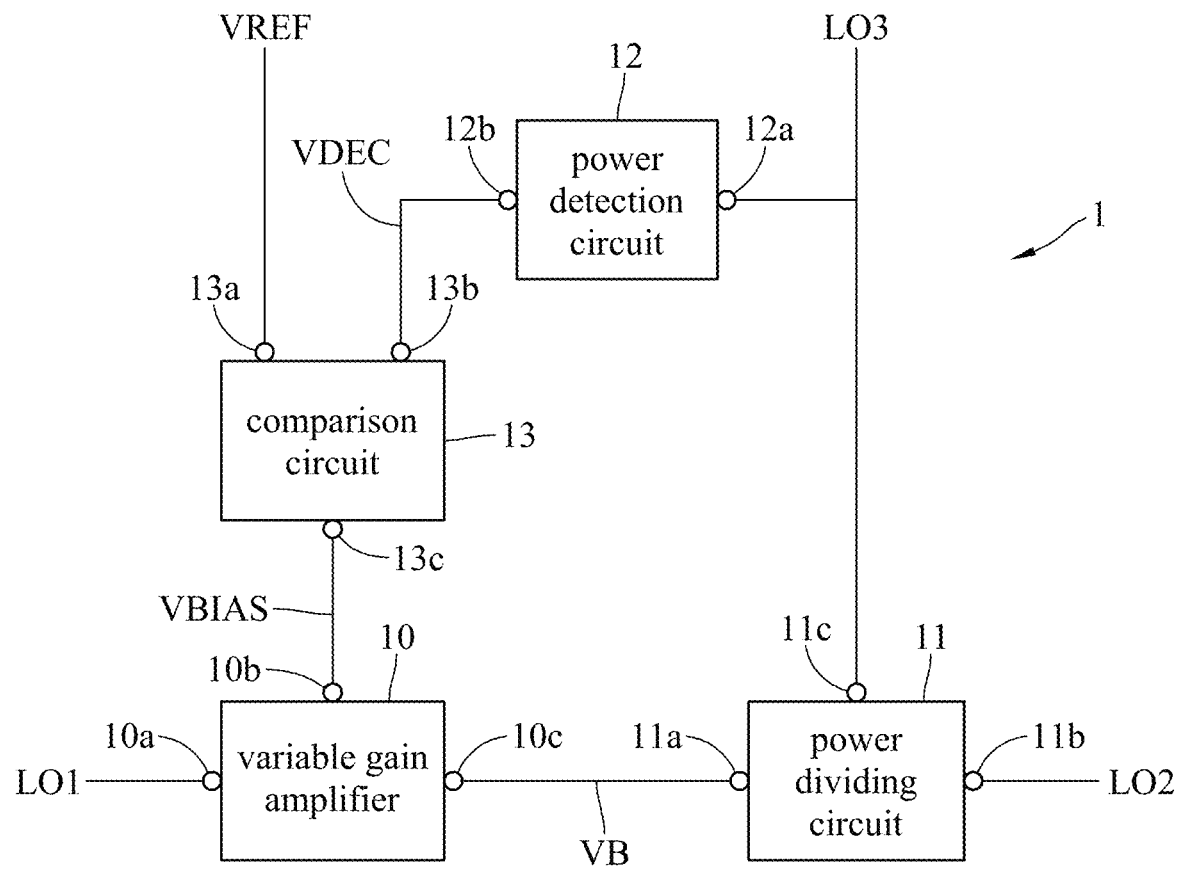
FIG. 1 is a block diagram of a power divider according to a first embodiment of the present disclosure.

FIG. 1 is a block diagram of a power divider according to a first embodiment of the present disclosure, as shown in FIG. 1, the power divider 1 comprises a variable gain amplifier 10, a power dividing circuit 11, a power detection circuit 12, and a comparison circuit 13. The variable gain amplifier 10 comprises a first input terminal 10a, a control terminal 10b and a first output terminal 10c. The first input terminal 10a is configured to receive a first local oscillation signal LO1, and a voltage of the control terminal 10b determines a gain between a variable output signal VB of the first output terminal 10c and the first local oscillation signal LO1. The power dividing circuit 11 comprises a second input terminal 11a, a second output terminal 11b, and a third output terminal 11c. The second input terminal 11a is electrically connected to the first output terminal 10c. The second output terminal 11b outputs a second local oscillation signal LO2 based on the variable output signal VB, and the third output terminal 11c is configured to output a third local oscillation signal LO3 to an up/down converter based on the variable output signal VB. The power detection circuit 12 comprises a third input terminal 12a and a fourth output terminal 12b. The third input terminal 12a is electrically connected to the third output terminal 11c and detects a power of the third local oscillation signal LO3. The fourth output terminal 12b outputs a detection voltage VDEC of the third local oscillation signal LO3. The comparison circuit 13 comprises a fourth input terminal 13a, a fifth input terminal 13b, and a fifth output terminal 13c. The fourth input terminal 13a is configured to receive a reference voltage VREF, and the fifth input terminal 13b is electrically connected to the fourth output terminal 12b and receives the detection voltage VDEC, and the fifth output terminal 13c is electrically connected to the control terminal 10b and outputs a bias voltage VBIAS to the control terminal 10b. In this way, the variable gain amplifier 10, the power dividing circuit 11, the power detection circuit 12, and the comparison circuit 13 form a loop structure.

Figure 2:
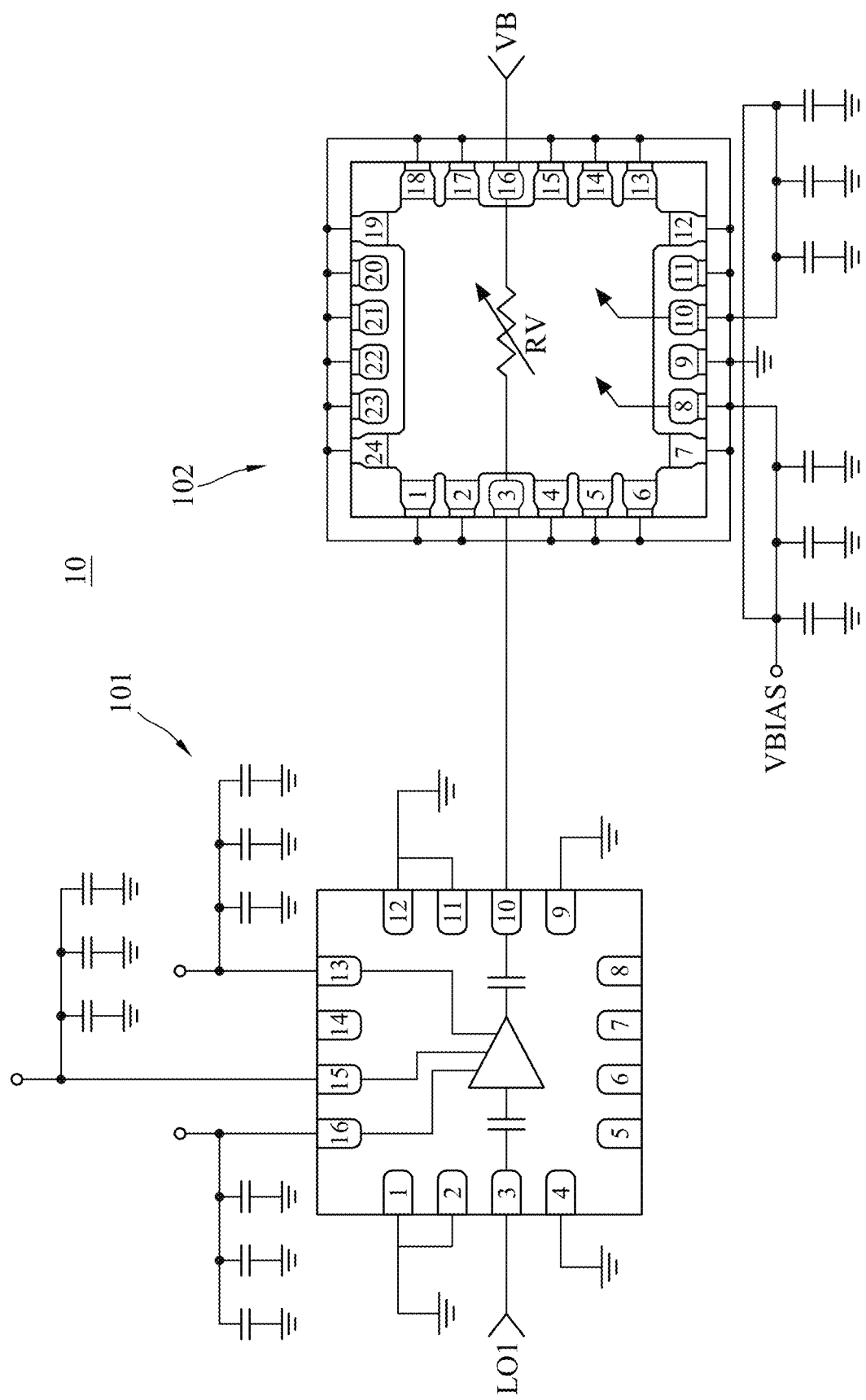
FIG. 2 is a circuit diagram of the variable gain amplifier of FIG. 1 according to one embodiment of the present disclosure.

FIG. 2 is a block diagram of the variable gain amplifier 10 of FIG. 1 according to one embodiment of the present disclosure. As shown in FIG. 2, the variable gain amplifier 10 comprises a fixed gain amplifier 101 and a variable attenuator 102. A third pin of the fixed gain amplifier 101 serves as the first input terminal 10a, and the third pin of the fixed gain amplifier 101 is configured to receive the first local oscillation signal LO1. A tenth pin of the fixed gain amplifier 101 is electrically connected to a third pin of the variable attenuator 102. An eighth pin of the variable attenuator 102 serves as the control terminal 10b, and a sixteenth pin of the variable attenuator 102 serves as the first output terminal 10c. The variable attenuator 102 comprises a variable resistor (RV), a resistance of the variable resistor (RV) changes with a bias voltage (VBIAS) received by the eighth pin of the variable attenuator 102, and an intensity of the variable output signal (VB) outputted by the sixteenth pin of the variable attenuator 102 changes with the resistance of the variable resistor (RV).

Figure 3:
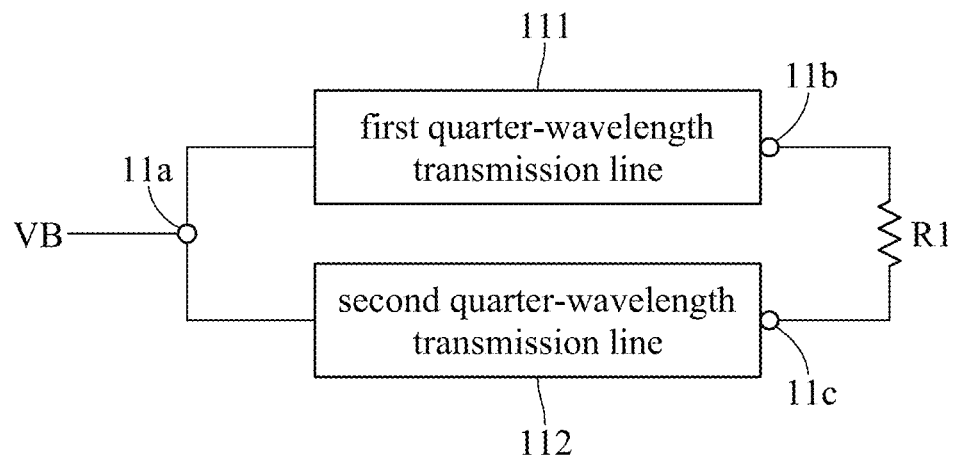
FIG. 3 is circuit diagram of the power dividing circuit of FIG. 1 according to one embodiment of the present disclosure.

FIG. 3 is a circuit diagram of the power dividing circuit 11 of FIG. 1 according to one embodiment of the present disclosure. As shown in FIG. 3, the power dividing circuit 11 comprises a first quarter-wavelength transmission line 111, a second quarter-wavelength transmission line 112, and a first resistor R1. One end of the first quarter-wavelength transmission line 111 and one end of the second quarter-wavelength transmission line 112 are commonly connected and jointly serve as the second input terminal 11a, which receive the variable output signal VB from the sixteenth pin of the variable attenuator 102. The other end of the first quarter-wavelength transmission line 111 and the other end of the second quarter-wavelength transmission line 112 serve as the second output terminal 11b and the third output terminal 11c respectively, and the second output terminal 11b and the third output terminal 11c are respectively connected to two ends of the first resistor R1. A first characteristic impedance Z1 of the first quarter-wavelength transmission line 111 and a second characteristic impedance Z2 of the second quarter-wavelength transmission line 112 may determine two transmission coefficients of the second output terminal 11b and the third output terminal 11c and an input impedance of the power dividing circuit 11. For example, a desired power ratio of the third output terminal 11c to the second output terminal 11b is $K^2$. A value of a reference impedance Z0 can be 50 Ohm. The design rule of the first characteristic impedance Z1, the design rule of the second characteristic impedance Z2, and the design rule of the first resistor R1 are as follows:

$$Z1 = Z0\sqrt{\frac{1+K^2}{K^3}}.$$

$$Z2 = Z0\sqrt{K(1+K^2)}.$$

$$R1 = Z0\left(1+\frac{1}{K}\right).$$

Figure 4:
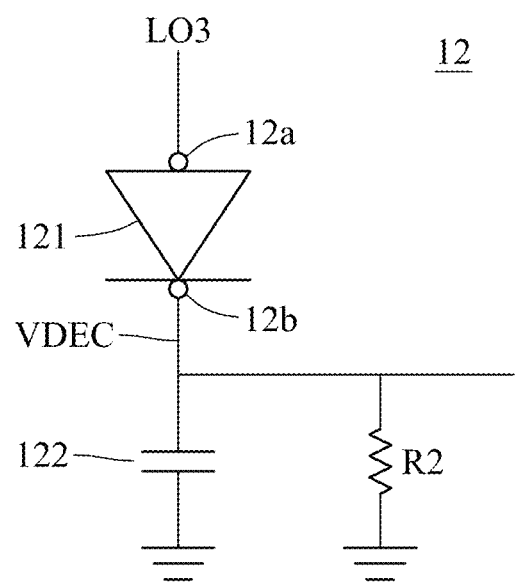
FIG. 4 is a circuit diagram of the power detection circuit of FIG. 1 according to one embodiment of the present disclosure.

FIG. 4 is a circuit diagram of the power detection circuit 12 of FIG. 1 according to one embodiment of the present disclosure. As shown in FIG. 4, the power detection circuit 12 comprises a diode 121, a capacitor 122 and a second resistor R2. The capacitance of the capacitor 122 is 1 nF and the resistance of the second resistor R2 is 10K ohms. An anode of the diode 121 serves as the third input terminal 12a, and the anode is electrically connected to the third output terminal 11c of the power dividing circuit 11 and receives the third local oscillation signal LO3 from the power dividing circuit 11. A cathode of the diode 121 serves as the fourth output terminal 12b. The cathode is electrically connected to one end of the capacitor 122 and one end of the second resistor R2. The other end of the capacitor 122 and the other end of the second resistor R2 are grounded, and the voltage level of the cathode is at a detection voltage of the third local oscillation signal LO3. The diode 121 can maintain a peak of the third local oscillation signal LO3, and the capacitor 122 and the second resistor R2 can control a holding period of the peak and prevent the third local oscillation signal LO3 from leaking to the fourth output terminal 12b of the power detection circuit 12 LO3.

Figure 5:
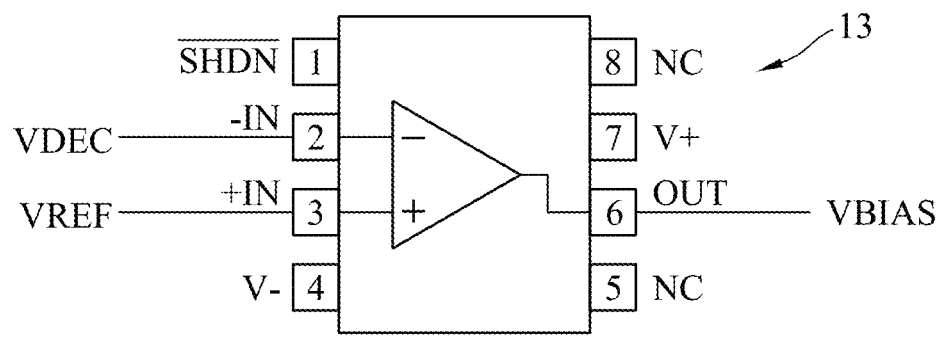
FIG. 5 is a circuit diagram of the comparison circuit of FIG. 1 according to one embodiment of the present disclosure.

FIG. 5 is a circuit diagram of the comparison circuit 13 of FIG. 1 according to one embodiment of the present disclosure. As shown in FIG. 5, a third pin of the comparison circuit 13 serves as the fourth input terminal 13a and is configured to receive the reference voltage VREF. A second pin of the comparison circuit 13 serves as the fifth input terminal 13b and receives the detection voltage VDEC from the power detection circuit 12. A sixth pin of the comparison circuit 13 serves as the fifth output terminal 13c and outputs the bias voltage VBIAS to an eighth pin of the variable attenuator 102.

Figure 6:
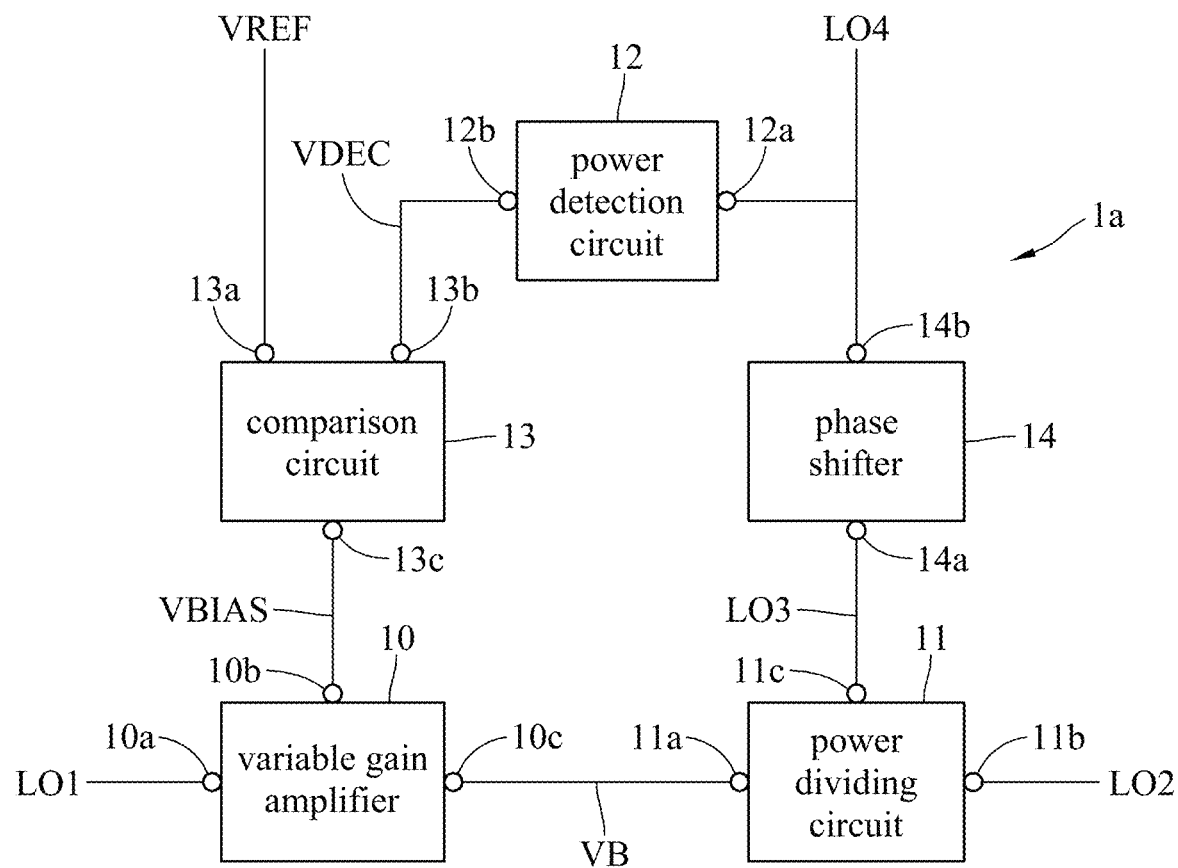
FIG. 6 is a block diagram of a power divider according to a second embodiment of the present disclosure.

FIG. 6 is a block diagram of a power divider 1a according to a second embodiment of the present disclosure. As shown in FIG. 6, comparing a power divider 1a shown in FIG. 6 with the power divider 1 shown in FIG. 1, the power divider 1a shown in FIG. 6 further comprises a phase shifter 14, and the phase shifter 14 comprises a sixth input terminal 14a and a sixth output terminal 14b. The sixth input terminal 14a is electrically connected to the third output terminal 11c of the power dividing circuit 11 and receives the third local oscillation signal LO3 from the power dividing circuit 11. The sixth output terminal 14b is configured to output a fourth local oscillation signal LO4 to the up/down converter, and the sixth output terminal 14b is electrically connected to the third input terminal 12a of the power detection circuit 12. The third input terminal 12a is electrically connected to the sixth output terminal 14b and detects a power of the fourth local oscillation signal LO4. The fourth output terminal 12b outputs a detection voltage VDEC of the fourth local oscillation signal LO4. A power of the fourth local oscillation signal LO4 is the same as a power of the third local oscillation signal LO3, and a phase of the fourth local oscillation signal LO4 is different from a phase of the third local oscillation signal LO3.

Figure 7:
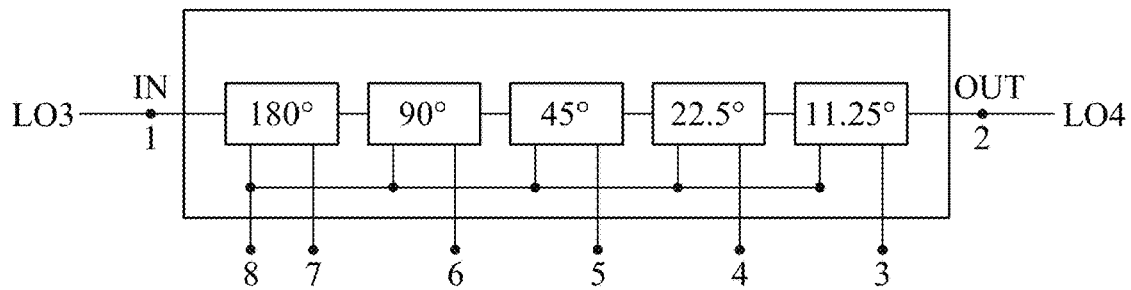
FIG. 7 is a circuit diagram of the phase shifter of FIG. 6 according to one embodiment of the present disclosure.

FIG. 7 is a circuit diagram of the phase shifter 14 of FIG. 6 according to one embodiment of the present disclosure. As shown in FIG. 7, a first pin of the phase shifter 14 serves as the sixth input terminal 14a and receives the third local oscillation signal LO3 from the power dividing circuit 11. A second pin of the phase shifter 14 serves as a sixth output terminal 14b and is configured to output the fourth local oscillation signal LO4 to the up/down converter. The anode of the diode 121 of the power detection circuit 12 receives the fourth local oscillation signal LO4.

Figure 8:
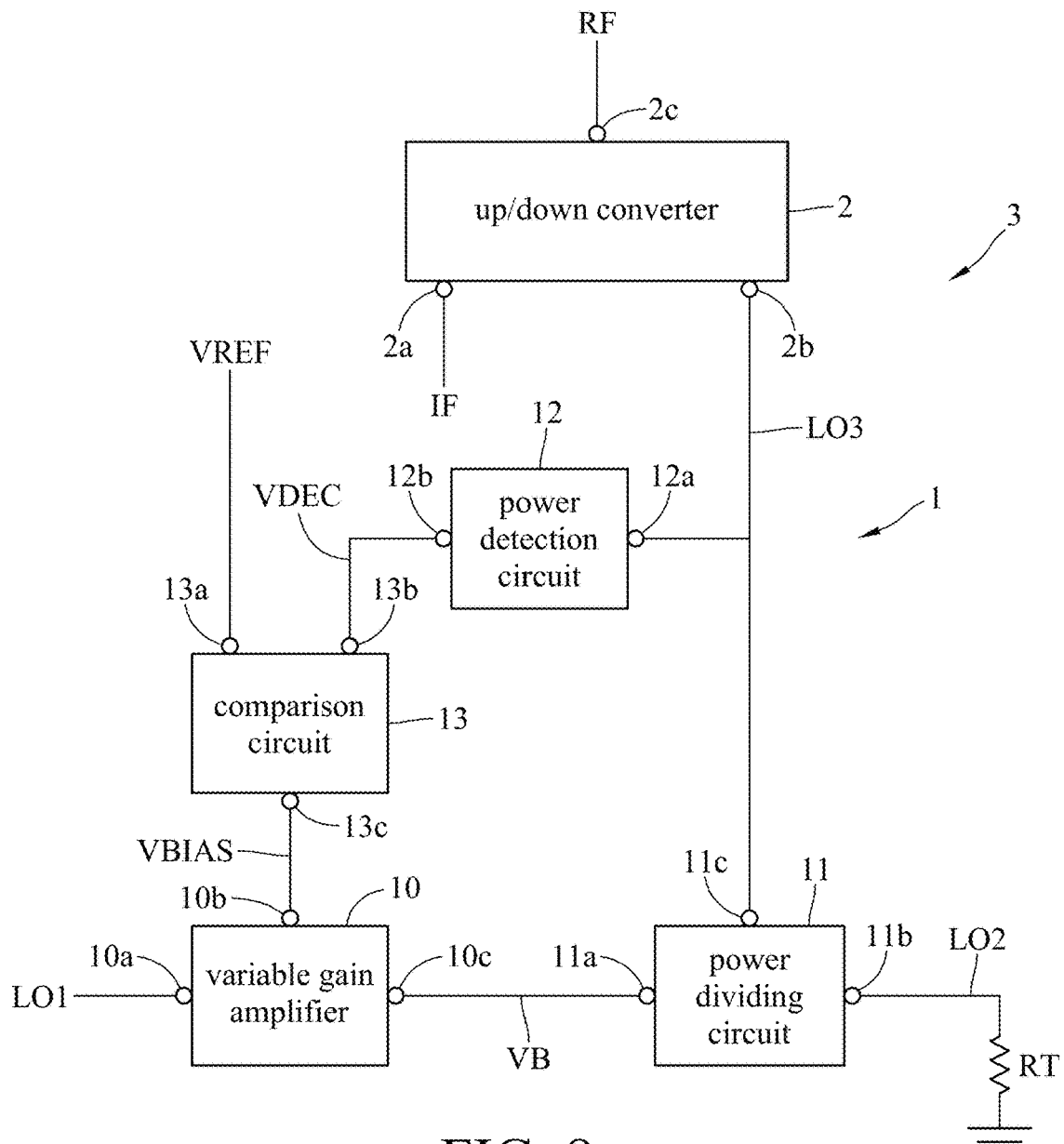
FIG. 8 is a block diagram of a radio frequency transceiver according to a first embodiment of the present disclosure.

FIG. 8 is a block diagram of a radio frequency transceiver 3 according to a first embodiment of the present disclosure. As shown in FIG. 8, a radio frequency transceiver 3 comprises the power divider 1 shown in FIG. 1 and an up/down converter 2, wherein an embodiment of the power divider 1 comprises the variable gain amplifier 10 shown in FIG. 1, the power dividing circuit 11 shown in FIG. 3, the power detection circuit 12 shown in FIG. 4, and the comparison circuit 13 shown in FIG. 5, and the second output terminal 11b of the power dividing circuit 11 is connected to a terminal resistor RT. The up/down converter 2 comprises an intermediate frequency (IF) signal terminal 2a, a local oscillation (LO) signal terminal 2b, and a radio frequency (RF) signal terminal 2c, and the IF signal terminal 2a is configured to receive an intermediate frequency signal IF. The LO signal terminal 2b is electrically connected to the third output terminal 11c of the power dividing circuit 11 of the power divider 1, and the local oscillation signal terminal 2b receives the third local oscillation signal LO3 from the power dividing circuit 11. The RF signal terminal 2c is configured to output a radio frequency signal RF based on a power of the intermediate frequency signal IF and a power of the third local oscillation signal LO3.

Figure 9:
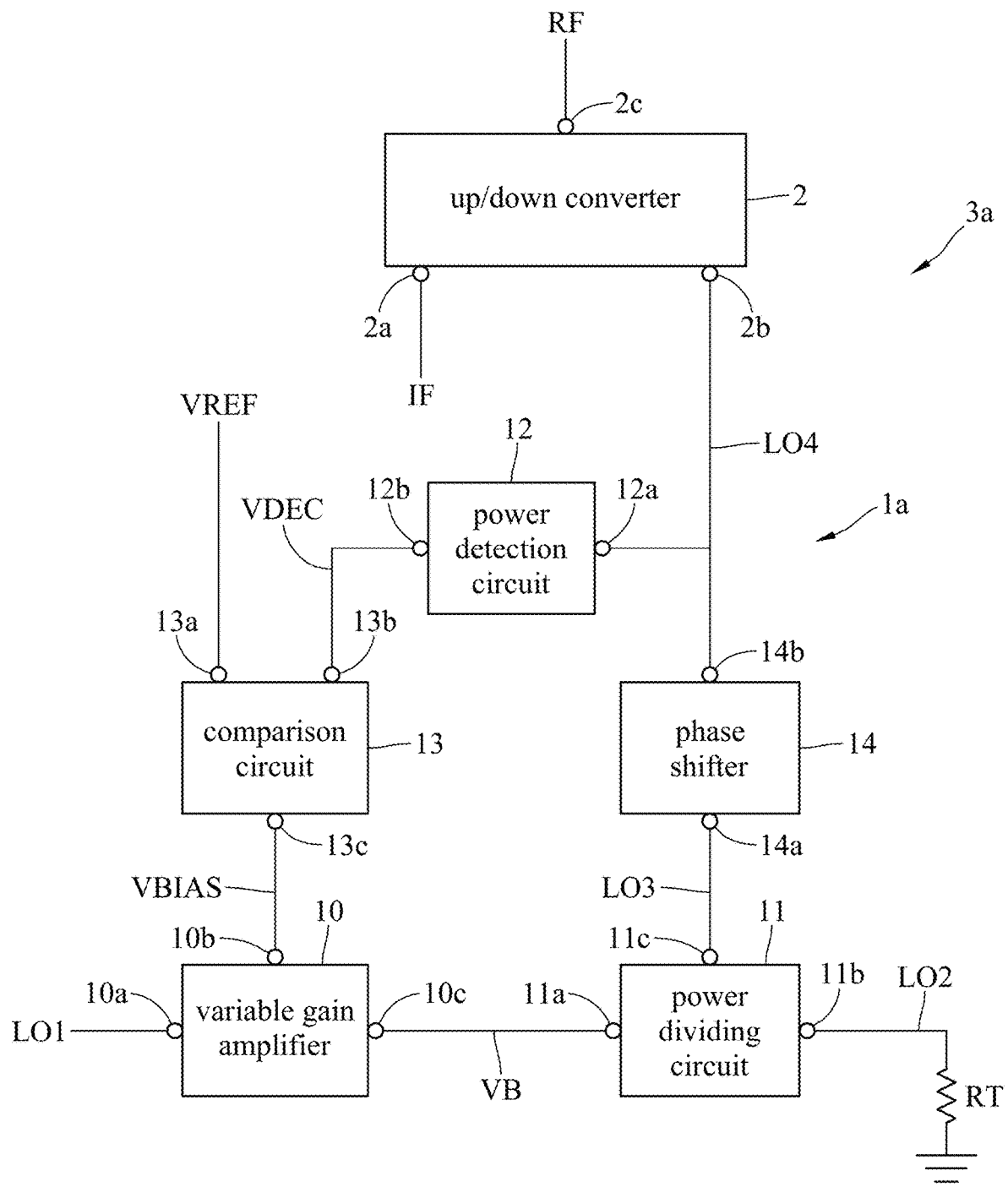
FIG. 9 is a block diagram of a radio frequency transceiver according to a second embodiment of the present disclosure.

FIG. 9 is a block diagram of a radio frequency transceiver 3a according to a second embodiment of the present disclosure. As shown in FIG. 9, comparing a radio frequency transceiver 3a shown in FIG. 9 with the radio frequency transceiver 3 shown in FIG. 8, the radio frequency transceiver 3a comprises the power divider 1a shown in FIG. 6 and the up/down converter 2. The sixth input terminal 14a of the phase shifter 14 of the power divider 1a receives the third local oscillation signal LO3 from the power dividing circuit 11. The sixth output terminal 14b of the phase shifter 14 outputs the fourth local oscillation signal LO4 to the local oscillation signal terminal 2b of the up/down converter 2 and is electrically connected to the third input terminal 12a of the power detection circuit 12. The third local oscillation signal LO3 and the fourth local oscillation signal LO4 has the same power, and a phase of the fourth local oscillation signal LO4 is different from a phase of the third local oscillation signal LO3. Further, the operational mechanism of the radio frequency transceiver 3a shown in FIG. 9 is the same as that of the radio frequency transceiver 3 shown in FIG. 8.

Figure 10:
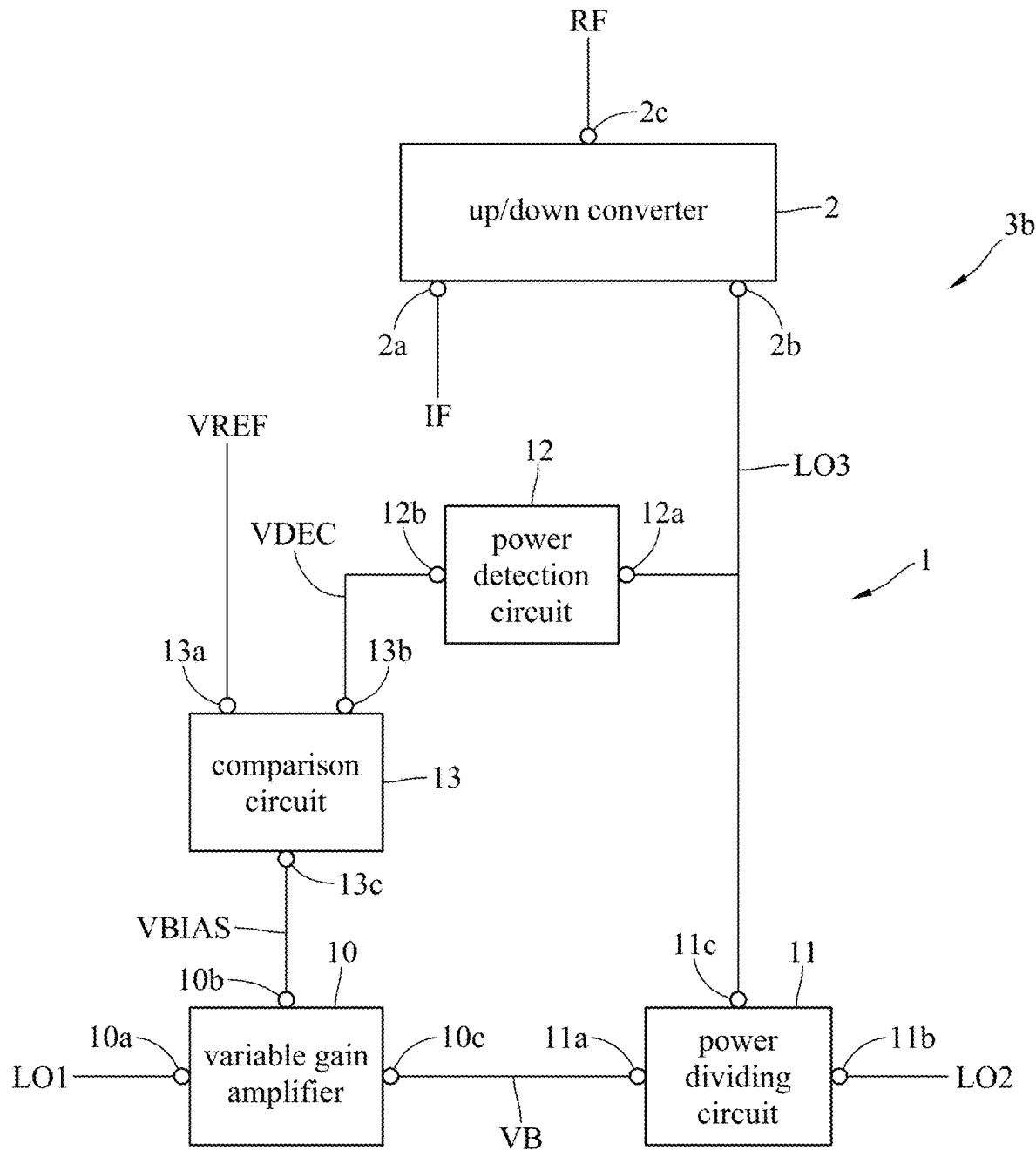
FIG. 10 is a block diagram of a radio frequency transceiver according to a third embodiment of the present disclosure.

FIG. 10 is a block diagram of a radio frequency transceiver 3b according to a third embodiment of the present disclosure. Comparing a RF transceiver 3b shown in FIG. 10 with the RF transceiver 3 shown in FIG. 8, except that the second output terminal 11b of the power dividing circuit 11 shown in FIG. 10 is floating, the other circuit layout of the RF transceiver 3b shown in FIG. 10 is the same as that of the RF transceiver 3 shown in FIG. 8. Further, the operational mechanism of the radio frequency transceiver 3b shown in FIG. 10 is the same as that of the radio frequency transceiver 3 shown in FIG. 8.

Figure 11:
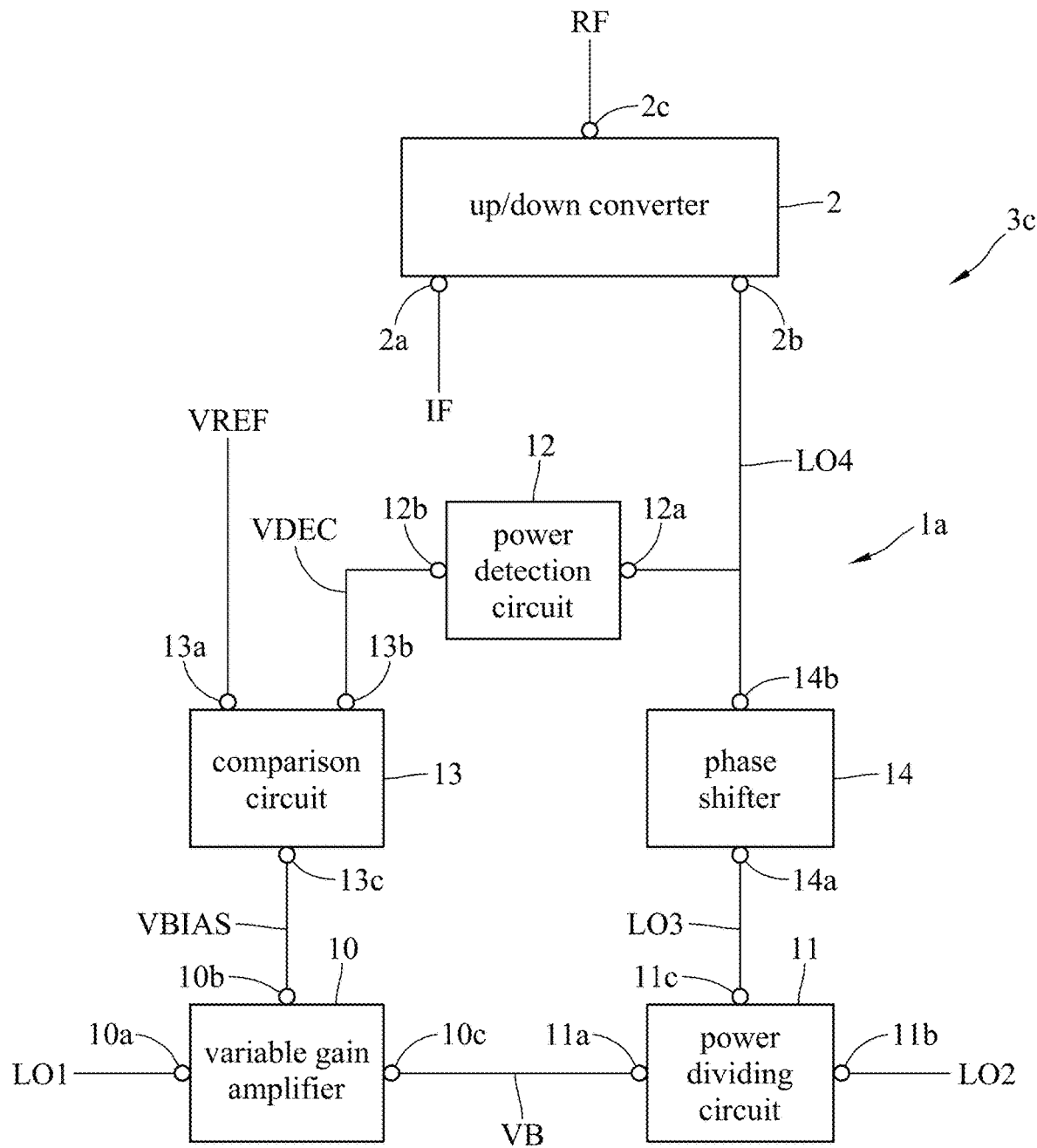
FIG. 11 is a block diagram of a radio frequency transceiver according to a fourth embodiment of the present disclosure.

FIG. 11 is a block diagram of a radio frequency transceiver 3c according to a fourth embodiment of the present disclosure. Comparing a RF transceiver 3c shown in FIG. 11 with the RF transceiver 3a shown in FIG. 9, except that the second output terminal 11b of the power dividing circuit 11 shown in FIG. 11 is floating, the other circuit layout of the RF transceiver 3c shown in FIG. 11 is the same as that of the RF transceiver 3a shown in FIG. 9. Further, the operational mechanism of the radio frequency transceiver 3c shown in FIG. 11 is the same as that of the radio frequency transceiver 3a shown in FIG. 9.

With respect to any one of the above embodiments shown in FIGS. 8-11, the power divider and the up/down converter may be integrated into an integrated circuit or separate circuit modules.

Figure 12:
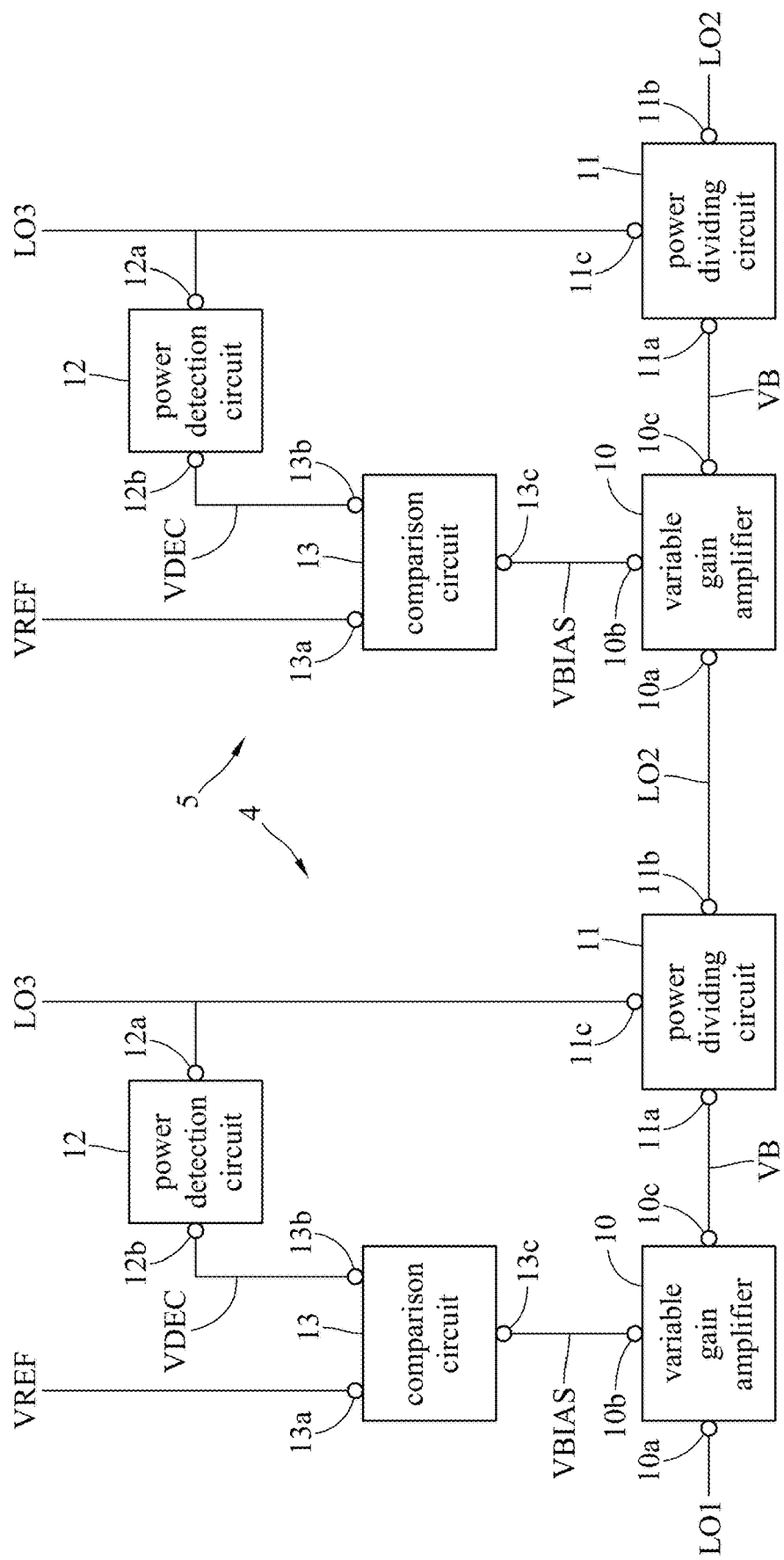
FIG. 12 is a block diagram of a multi-stage divider according to a first embodiment of the present disclosure.

FIG. 12 is a block diagram of a multi-stage divider according to a first embodiment of the present disclosure. The multi-stage power divider comprises a first power divider 4 and a second power divider 5, the first power divider 4 serves as the power divider 1 shown in FIG. 1, and the second power divider 5 serves as the power divider 1 shown in FIG. 1. The second output terminal 11b of the first power divider 4 is electrically connected to the first input terminal 10a of the second power divider 5.

With respect to the operation mechanism of the multi-stage power divider shown in FIG. 12, the second output terminal 11b of the power dividing circuit 11 of the first power divider 4 outputs the second local oscillation signal LO2 to the first input terminal 10a of the variable gain amplifier 10 of the second power divider 5.

Figure 13:
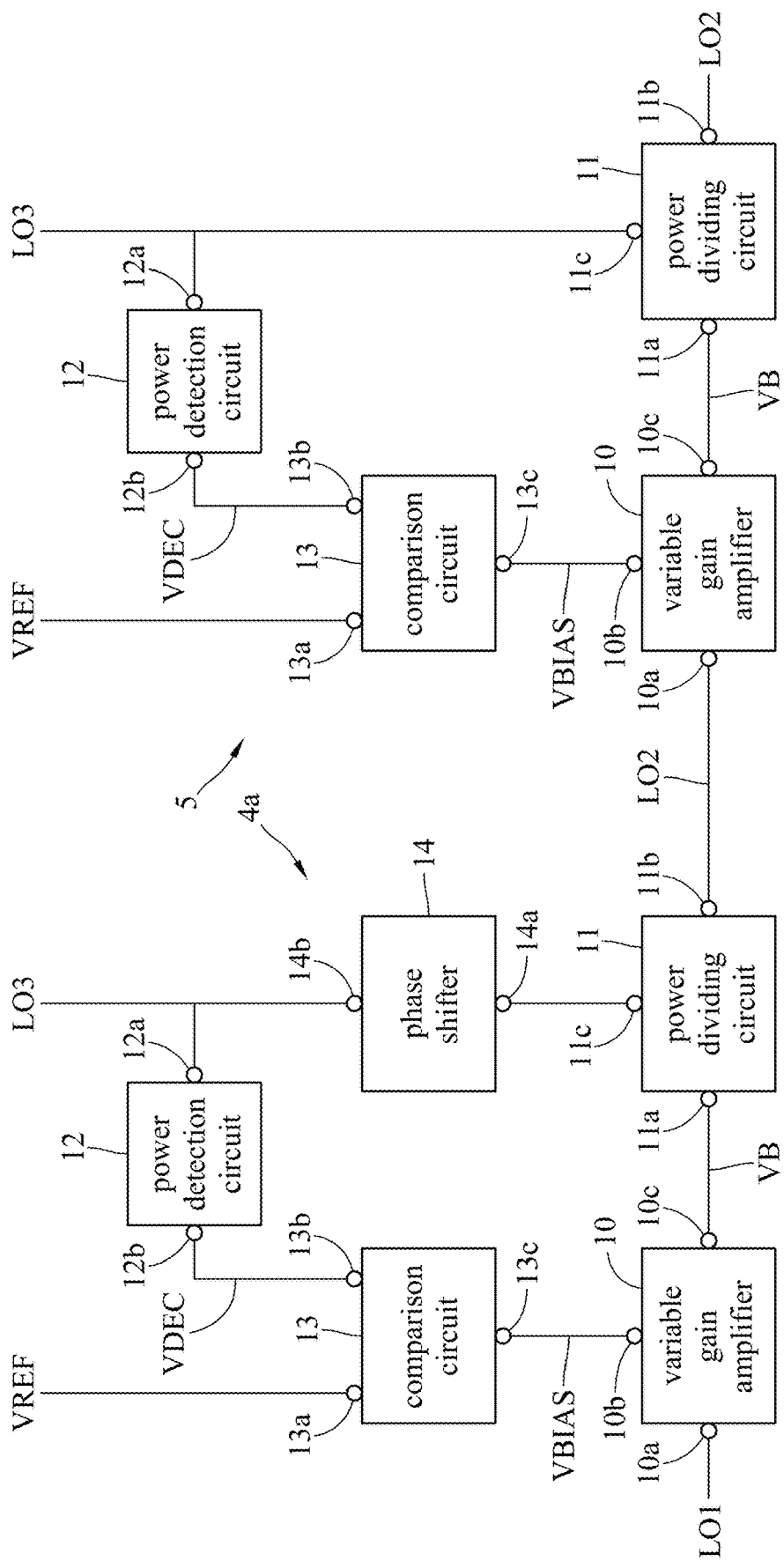
FIG. 13 is a block diagram of a multi-stage divider according to a second embodiment of the present disclosure.

FIG. 13 is a block diagram of a multi-stage divider according to a second embodiment of the present disclosure. The multi-stage power divider comprises a first power divider 4a and the second power divider 5, the first power divider 4a serves as the power divider 1a shown in FIG. 6, and the second power divider 5 serves as the power divider 1 shown in FIG. 1. The second output terminal 11b of the first power divider 4a is electrically connected to the first input terminal 10a of the second power divider 5. In addition, the operational mechanism of the multi-stage power divider shown in FIG. 13 is the same as that of the multi-stage power divider shown in FIG. 12.

Figure 14:
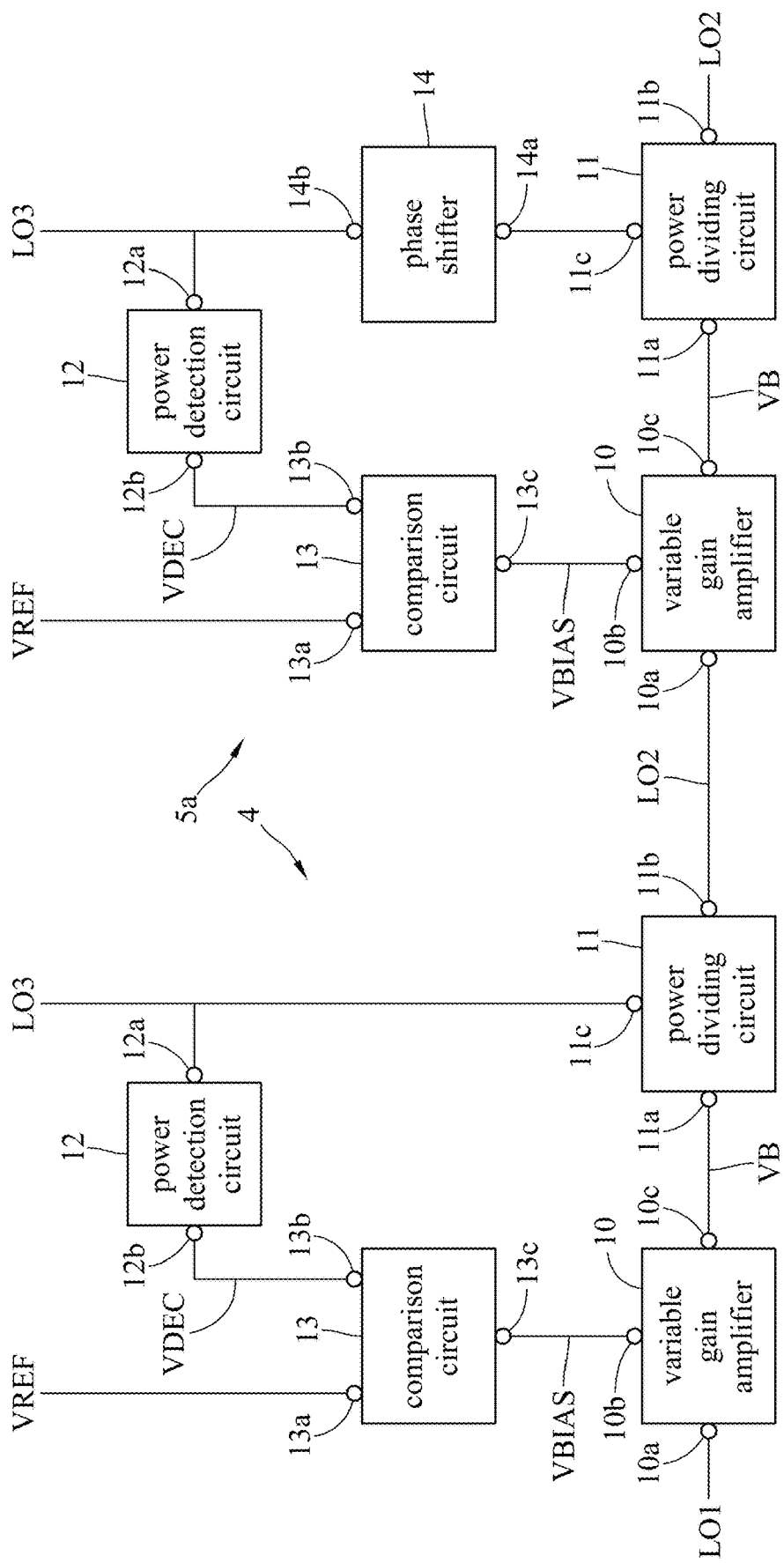
FIG. 14 is a block diagram of a multi-stage divider according to a third embodiment of the present disclosure.

FIG. 14 is a block diagram of a multi-stage divider according to a third embodiment of the present disclosure. The multi-stage power divider comprises the first power divider 4 and a second power divider 5a, the first power divider 4 serves as the power divider 1 shown in FIG. 1, and the second power divider 5a serves as the power divider 1a shown in FIG. 6. The second output terminal 11b of the first power divider 4 is electrically connected to the first input terminal 10a of the second power divider 5a. In addition, the operational mechanism of the multi-stage power divider shown in FIG. 14 is the same as that of the multi-stage power divider shown in FIG. 12.

Figure 15:
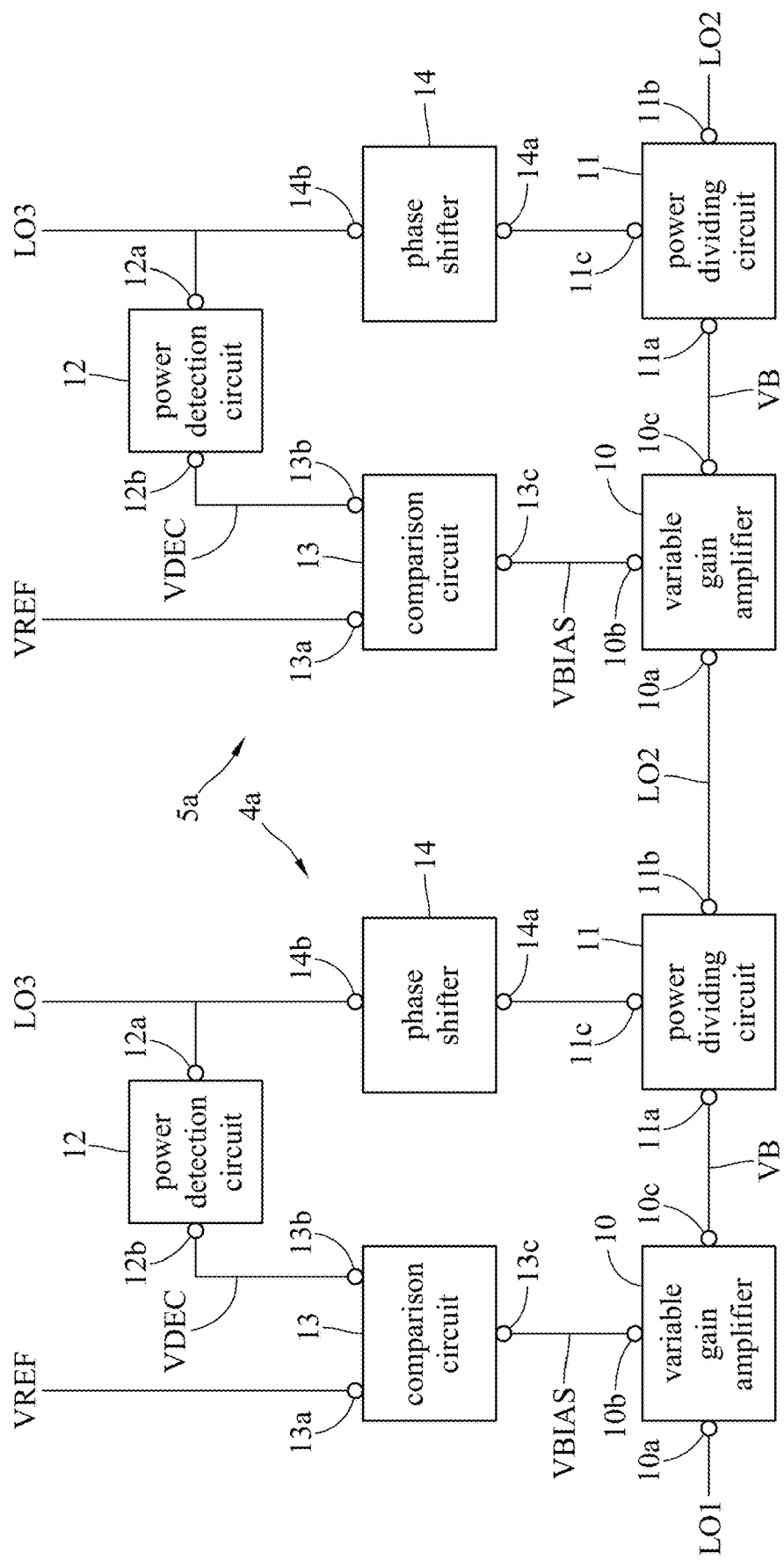
FIG. 15 is a block diagram of a multi-stage divider according to a fourth embodiment of the present disclosure.

FIG. 15 is a block diagram of a multi-stage divider according to a fourth embodiment of the present disclosure. The multi-stage power divider comprises the first power divider 4a and the second power divider 5a, the first power divider 4a serves as the power divider 1a shown in FIG. 6, and the second power divider 5a serves as the power divider 1a shown in FIG. 6. The second output terminal 11b of the first power divider 4a is electrically connected to the first input terminal 10a of the second power divider 5a. In addition, the operational mechanism of the multi-stage power divider shown in FIG. 15 is the same as that of the multi-stage power divider shown in FIG. 12.

Figure 16:
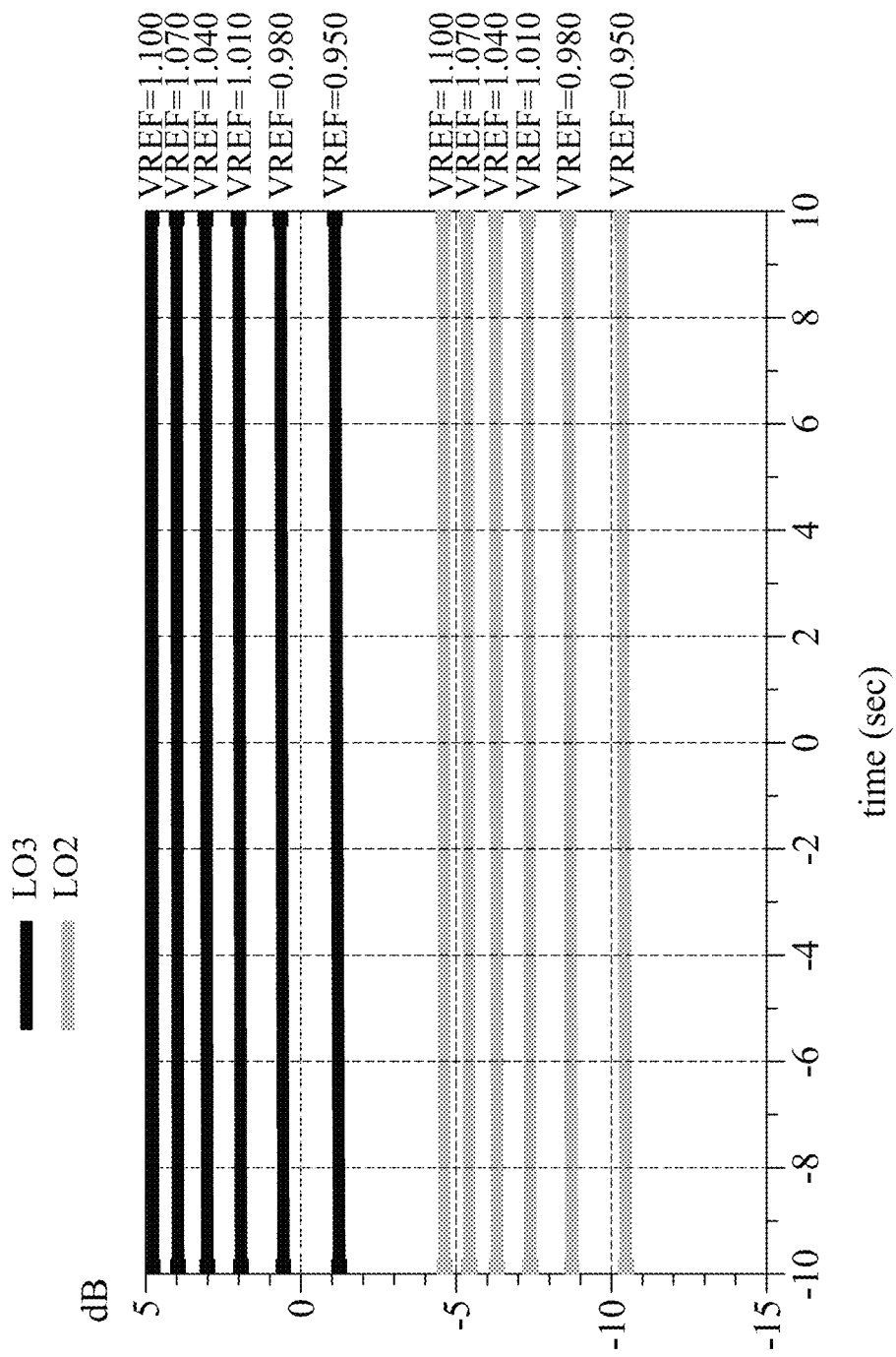
FIG. 16 is a relationship diagram related to a second local oscillation signal inputted into a next stage power divider, a third local oscillation signal inputted into an up/down converter and a reference voltage.

FIG. 16 is a relationship diagram related to a second local oscillation signal inputted into a next stage power divider, a third local oscillation signal inputted into an up/down converter and a reference voltage. As shown in FIG. 16, when the reference voltage VREF of the comparison circuit 13 is changed, the power of the third local oscillation signal LO3 inputted into the up/down converter 2 is changed. In addition, a power difference between the third local oscillation signal LO3 inputted into the up/down converter 2 and the second local oscillation signal LO2 inputted into the next-stage power divider is maintained at a fixed value, and the power difference between the third local oscillation signal LO3 and the second local oscillation signal LO2 is determined by the design of the power dividing circuit 11.

In view of the above description, the power divider, the radio frequency transceiver and the multi-stage power divider disclosed by the present invention at least have the following efficiencies: (1) When the number of the desired up/down converters is increased, a user only needs to increase the number of power dividers according to the number of desired up/down converters to ensure that all of the desired up/down converters are driven without redesigning the circuit layout of the power divider, so the power divider and the up/down converter are easier to integrate into an integrated circuit. (2) Through the variable gain amplifier of the power divider, the power divider does not require an initial oscillation signal with a large power, and also can provide a local oscillation signal whose power is sufficient to drive the up/down converter.

What is claimed is:

1. A power divider comprising:
   a variable gain amplifier comprising a first input terminal, a control terminal and a first output terminal, wherein the first input terminal is configured to receive a first local oscillation signal, and a voltage of the control terminal determines a gain between a variable output signal of the first output terminal and the first local oscillation signal;
   a power dividing circuit comprising a second input terminal, a second output terminal and a third output terminal, wherein the second input terminal is electrically connected to the first output terminal, the second output terminal outputs a second local oscillation signal based on the variable output signal, and the third output terminal is configured to output a third local oscillation signal based on the variable output signal to an up/down converter;
   a power detection circuit comprising a third input terminal and a fourth output terminal, wherein the third input terminal is electrically connected to the third output terminal and the fourth output terminal outputs a detection voltage; and
   a comparison circuit comprising a fourth input terminal, a fifth input terminal and a fifth output terminal, wherein the fourth input terminal is configured to receive a reference voltage, the fifth input terminal is electrically connected to the fourth output terminal and receives the detection voltage, and the fifth output terminal is electrically connected to the control terminal and outputs a bias voltage to the control terminal based on a comparison result;
   wherein the power detection circuit comprises a diode, a capacitor and a second resistor, an anode of the diode serves as the third input terminal, a cathode of the diode serves as the fourth output terminal, the cathode is directly connected to an end of the capacitor and an end of the second resistor, and the other end of the capacitor and the other end of the second resistor are grounded;
   wherein a power difference between the third local oscillation signal inputted into the up/down converter and the second local oscillation signal inputted into a next-stage power divider is maintained at a fixed value.

2. The power divider in claim 1, further comprising a phase shifter, wherein the phase shifter comprises a sixth input terminal and a sixth output terminal, the sixth input terminal is electrically connected to the third output terminal of the power dividing circuit, and the sixth output terminal is electrically connected to the third input terminal of the power detection circuit.

3. The power divider in claim 2, wherein the sixth input terminal receives the third local oscillation signal from the power dividing circuit, the sixth output terminal outputs a fourth local oscillation signal to an up/down converter, the third input terminal detects a power of the fourth local oscillation signal, and the fourth output terminal outputs the detection voltage of the fourth local oscillation signal.

4. The power divider in claim 1, wherein the power dividing circuit comprises a first quarter-wavelength transmission line, a second quarter-wavelength transmission line and a first resistor, an end of the first quarter-wavelength transmission line and an end of the second quarter-wavelength transmission line are commonly connected and jointly serve as the second input terminal, and the other end of the first quarter-wavelength transmission line and the other end of the second quarter-wavelength transmission line serve as the second output terminal and the third output terminal respectively and are connected to two ends of the first resistor respectively.

5. The power divider in claim 1, wherein when the detection voltage is larger than the reference voltage, the comparison circuit decreases the bias voltage; and when the detection voltage is smaller than the reference voltage, the comparison circuit increases the bias voltage.

6. The power divider in claim 1, wherein the third input terminal detects a power of the third local oscillation signal, and the fourth output terminal outputs the detection voltage of the third local oscillation signal.

7. A radio frequency transceiver comprising:
the power divider as claimed in claim 1; and
an up/down converter comprising an intermediate frequency signal terminal, a local oscillation signal terminal and a radio frequency signal terminal, wherein the intermediate frequency signal terminal is configured to receive the intermediate frequency signal, the local oscillation signal terminal is electrically connected to the third input terminal of the power detection circuit, and the radio frequency signal terminal is configured to output a radio frequency signal.

8. The radio frequency transceiver in claim 7, wherein the power divider and the up/down converter are integrated in an integrated circuit.

9. The radio frequency transceiver in claim 7, further comprising a phase shifter, wherein the phase shifter comprises a sixth input terminal and a sixth output terminal, the sixth input terminal is electrically connected to the third output terminal of the power dividing circuit, and the sixth output terminal is electrically connected to the third input terminal of the power detection circuit.

10. The radio frequency transceiver in claim 9, wherein the power divider and the up/down converter are integrated in an integrated circuit.

11. The radio frequency transceiver in claim 9, wherein the sixth input terminal receives the third local oscillation signal from the power dividing circuit, the sixth output terminal outputs a fourth local oscillation signal to the local oscillation signal terminal of the up/down converter, the third input terminal detects a power of the fourth local oscillation signal, and the fourth output terminal outputs the detection voltage of the fourth local oscillation signal.

12. The radio frequency transceiver in claim 7, wherein the power dividing circuit comprises a first quarter-wavelength transmission line, a second quarter-wavelength transmission line and a first resistor, an end of the first quarter-wavelength transmission line and an end of the second quarter-wavelength transmission line are commonly connected and jointly serve as the second input terminal, and the other end of the first quarter-wavelength transmission line and the other end of the second quarter-wavelength transmission line serve as the second output terminal and the third output terminal respectively and are connected to two ends of the first resistor respectively.

13. The radio frequency transceiver in claim 7, wherein when the detection voltage is larger than the reference voltage, the comparison circuit decreases the bias voltage; and when the detection voltage is smaller than the reference voltage, the comparison circuit increases the bias voltage.

14. The radio frequency transceiver in claim 7, wherein the second output terminal is connected to a terminal resistor.

15. The radio frequency transceiver in claim 7, wherein the second output terminal is floating.

16. The radio frequency transceiver in claim 7, wherein the third input terminal detects a power of the third local oscillation signal, and the fourth output terminal outputs the detection voltage of the third local oscillation signal.

17. A multi-stage power divider comprising:
two power dividers, wherein each of the power dividers is as claimed in claim 1, wherein one of the two power dividers is a first power divider, the other of the two power dividers is a second power divider, and the second output terminal of the first power divider is connected to the first input terminal of the second power divider.

* * * * *